United States Patent [19]

Eggermont

[11] 4,167,731
[45] Sep. 11, 1979

[54] INTEGRATING CODE CONVERTER

[75] Inventor: Ludwig D. J. Eggermont, Eindhoven, Netherlands

[73] Assignee: U.S. Philips Corporation, New York, N.Y.

[21] Appl. No.: 910,122

[22] Filed: May 26, 1978

[30] Foreign Application Priority Data

Jul. 22, 1977 [NL] Netherlands ............... 7708159

[51] Int. Cl.² ............... G06F 5/06; H03K 13/22
[52] U.S. Cl. ............... 340/347 DD
[58] Field of Search ............. 340/347 DD; 325/38 B; 332/11 D

[56] References Cited

U.S. PATENT DOCUMENTS

| | | | |
|---|---|---|---|
| 3,596,267 | 7/1971 | Goodman | 340/347 DD |
| 3,633,170 | 1/1972 | Jones | 325/38 B |
| 3,707,712 | 12/1972 | Deschenes | 340/347 DD |
| 3,906,400 | 9/1975 | Gooding | 325/38 B |
| 3,987,288 | 10/1976 | Franks | 325/38 B |
| 4,002,981 | 1/1977 | Eggermont | 340/347 DD |
| 4,035,724 | 7/1977 | Stephenne | 325/38 B |

Primary Examiner—Charles D. Miller
Attorney, Agent, or Firm—Thomas A. Briody; Edward J. Connors, Jr.; James J. Cannon, Jr.

[57] ABSTRACT

Arrangement for converting a differential code into an absolute code which comprises a non-recursive interpolating digital filter, to which input code words are applied, with a sampling frequency $f_s$, for supplying auxiliary code words occurring with an increased sampling frequency $mf_s$, and a digital intergrator for converting the auxiliary code words into output code words, also with a sampling frequency $mf_s$.

2 Claims, 2 Drawing Figures

INTEGRATING CODE CONVERTER

BACKGROUND OF THE INVENTION

1. Field of the Invention

The invention relates to an arrangement for converting a sequence of digital input code words occurring with a first sampling frequency ($f_s$) and representative of changes in the instantaneous amplitude of a data signal (differential code) into a sequence of output code words occurring with a second, higher sampling frequency ($mf_s$) and characterizing the instantaneous amplitude of the data signal (absolute code).

The invention stems from the field of the code converters for converting a first code format into a second code format, while simultaneously increasing the sampling frequency.

2. Description of the Prior Art

Such a code converter is disclosed in published Dutch Patent Application 7307237 (PHN 6911). In the embodiment of FIG. 1 of that patent application a sequence of digital input code words which characterize the instantaneous amplitude of a data signal is applied with sampling frequency $f_s$ to a non-recursive interpolating digital filter. At the output of the interpolating filter output code words occur which are also representative of the instantaneous amplitude of the data signal but whose sampling frequency ($mf_s$) exceeds the sampling frequency ($f_s$) of the input code words, these output code words then being converted by means of a delta modulation coder into code words characterizing the changes in the instantaneous amplitude of the data signal.

In practice the need was felt for an arrangement for converting DPCM into delta modulation. The code converter as described in the above-mentioned Dutch Patent Application can be used to this end if the differential code (DPCM) is first converted into an absolute code (PCM) by digital integration of the input code words. Such an arrangement has, however, the drawback that a large storage capacity is required in the interpolating filter for storing the integrated input code words.

SUMMARY OF THE INVENTION

It is an object of the invention to realize a saving in equipment or storage capacity by providing a different concept of an arrangement of the type discribed in the preamble.

To this end the arrangement according to the invention comprises a non-recursive interpolating digital filter to which the input code words are applied for supplying a sequence of digital auxiliary code words occurring with said second sampling frequency ($mf_s$) and which are also representative of changes in the instantaneous amplitude of the data signal, and in that a digital integrator is provided for converting the auxiliary code words into said output code words.

The saving obtained by using the measure according to the invention consists in that the storage capacity required in the interpolating filter for storing the code words to be interpolated can be small. This is because interpolation is now effected between the input code words which consist of less bits than the code words obtained after integration of the input code words.

BRIEF DESCRIPTION OF THE DRAWINGS

The invention will now be explained in greater detail with reference to the drawing in which.

DESCRIPTION OF THE PREFERRED EMBODIMENT

Figure 1:
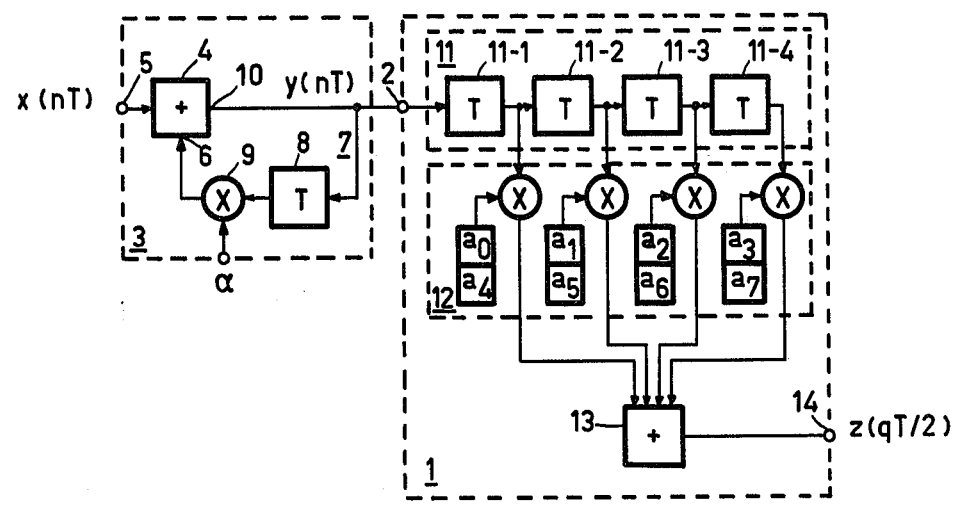
FIG. 1 shows an embodiment of an arrangement for converting DPCM with a sampling frequency $f_s$ into PCM with a sampling frequency $mf_s$ (m=2).

The arrangement shown in FIG. 1 comprises a non-recursive interpolating digital filter 1 as used in the code converter in accordance with said Dutch Patent Application 7307237 (PHN 6911) for increasing the sampling frequency of a PCM signal applied to an input 2. In order to satisfy the practical need for an arrangement for the conversion of DPCM-signals a digital integrator 3 is connected to the input 2 of the filter 1. The digital integrator 3 comprises an adding device 4 having a first input 5 to which digital input code words occurring with a first sampling frequency $f_s$, are applied which are representative of changes in the instantaneous amplitude of a data signal (for example DPCM) and which are denoted by x(nT) in the drawing. The PCM signal occurring at the ouput 10 of the adding device 4 is applied to a second input 6 of the adding device 4 via a feedback circuit 7, which includes a delay section 8 and a multiplier 9. This PCM signal is composed of code words which are indicated by y(nT) in the drawing. The terms x(nT) and y(nT) denote in conventional manner that the code words x and y occur at instants which correspond to an integral multiple of the sampling period $T = 1/f_s$. The PCM code words y(nT) are applied to the input 2 of the filter 1 and delayed each time by a sampling period T in consecutive sections 11-1, 11-2, 11-3 and 11-4 of a delay device 11. The delay device 11 can, for example, be constituted by a shift register to which shift pulses having a frequency $f_s$ are applied in conventional manner for realizing a delay time T. In each sampling period a series of four PCM words y(nT) are first multiplied in a multiplying circuit 12 by a first series of four filter coefficients ($a_0$, $a_1$, $a_2$, $a_3$), for supplying a first output code word after addition in an accumulator 13. Thereafter the same series of four PCM words y(nT) is multiplied by a second series of filter coefficients ($a_4$, $a_5$, $a_6$, $a_7$) and a second output code word is obtained by adding the products obtained. The output code words occur at an output 14 of the arrangement and are denoted by z(qT/2) to indicate that the sampling frequency of the output code words is $2f_s = 2/T$.

The relation between the input code words x(nT) and the output code words z(qT/2) can be given as:

for $q=2n$, $z(qT/2)=$ $$=a_3y\,[(n-4)T]+a_2y\,[(n-3)T]+a_1y\,[(n-2)T]+a_0y\,[(n-1)T]$$

for $q=2n+1$, $z(qT/2)=$ $$=a_7y[(n-4)T]+a_6y[(n-3)T]+a_5y[(n-2)T]+a_4y[(n-1)T]$$

and $y(nT)=x(nT)+ay[(n-1)T]$, where $a(\alpha<1)$ is the multiplication factor of multiplier 9.

With the embodiment shown in FIG. 1 of an arrangement for converting DPCM, with a sampling frequency $f_s$ into PCM, with a sampling frequency $mf_s (m=2)$, each of the input code words $x(nT)$ consists of, for example, 8 bits. Owing to the integration the code words $y(nT)$ must consist of more than 8 bits, for example 10 bits, in order to characterize the instantaneous amplitude of the data signal sufficiently accurately. Each of the delay sections 11-1, 11-2, 11-3 and 11-4 must therefore be able to store 10-bit code words. Also the multiplying circuit 12 must be implemented so that the 10-bit code words can be processed.

In accordance with the invention a saving in storage room for an arrangement for converting a sequence of digital input code words occurring with a first sampling frequency ($f_s$) and representative of changes in the instantaneous amplitude of a data signal (differential code) into a sequence of output code words occurring with a second, higher sampling frequency ($mf_s$) and characterizing the instantaneous amplitude of the data signal (absolute code) is realized by providing the device with a nonrecursive interpolating digital filter to which the input code words are applied for supplying a sequence of digital auxiliary code words occurring with said second sampling frequency ($mf_s$) and also being representative of changes in the instantaneous amplitude of the data signal and with a digital integrator for converting the auxiliary code words into said output code words.

Figure 2:
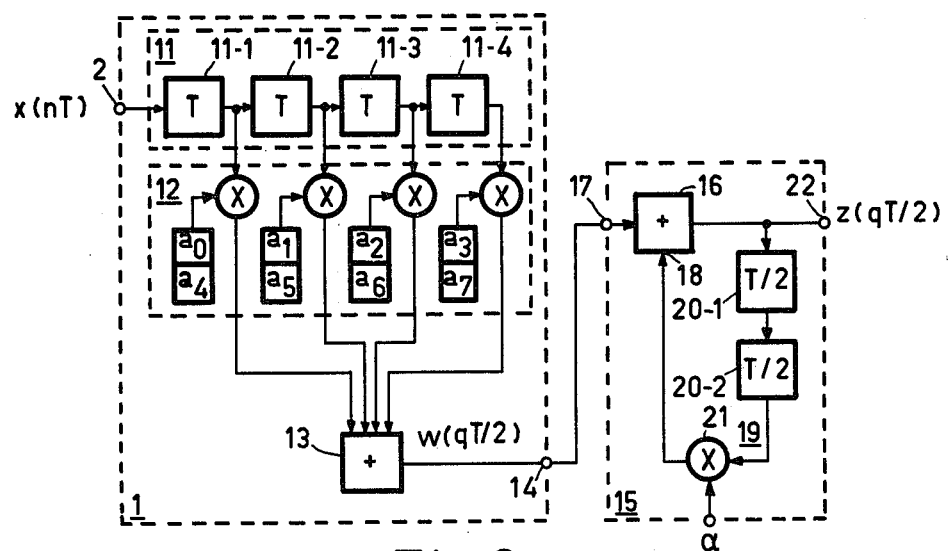
FIG. 2 shows an embodiment of an arrangement according to the invention.

In the embodiment shown in FIG. 2 of an arrangement according to the invention, components corresponding with those in the arrangement shown in FIG. 1 have been given the same reference numerals.

The embodiment shown comprises a non-recursive interpolating digital filter 1 which comprises a delay device 11 having four delay sections 11-1, 11-2, 11-3 and 11-4, a multiplying circuit 12 and an accumulator 13. A digital integrator 15 comprises an adding device 16 whose first input 17 is connected to the output 14 of the filter 1. The PCM signal occurring at the output 22 of the integrator 15 is applied to a second input 18 of the adding device 16 via a feedback circuit 19, which includes two delay sections 20-1 and 20-2 and a multiplier 21. The multiplier 21 multiplies the code words by a factor $\alpha (\alpha < 1)$. In the general case, if the filter 1 is arranged for increasing the sampling frequency by a factor of m, the digital integrator 15 must comprise m delay sections, each realizing a delay over a period of time $T/m$.

The sequence of digital input code words occurring with a first sampling frequency $f_s$ and representative of changes in the instantaneous amplitude of an information signal (differential code), applied to the input 2 of the filter 1 are indicated by $x(nT)$. The sequence of digital auxiliary code words occurring with a second sampling frequency $mf_s$ (m=2) and also representative of changes in the instantaneous amplitude of the data signal generated by filter 1 at the output 14 are denoted by $w(qT/2)$. The output code words which occur at the output 22 of the digital integrator 15 also with a sampling frequency $mf_s$ (m=2) and which characterize the instantaneous amplitude of the data signal are denoted by $z(qT/2)$.

The following relation exists between $z(qT/2)$ and $x(nT)$:

$$z(qT/2) = w(qT/2) + \alpha z[(q-2)T/2] \text{ and}$$

for $q=2n$, $w(qT/2) =$ $$= a_3 x[(n-4)T] + a_2 x[(n-3)T] + a_1 x[(n-2)T] + a_0 x[(n-1)T]$$

for $q=2n+1$, $w(qT/2) =$ $$= a_7 x[(n-4)T] + a_6 x[(n-3)T] + a_5 x[(n-2)T] + a_4 x[(n-1)T].$$

By elaborating the above relation it can be proved that the output code words supplied by the arrangement shown in FIG. 2 are equal to the output code words supplied by the arrangement shown in FIG. 1 if the same input code words are offered to both arrangements. The same applies for the general case when the sampling frequency is increased by a factor of m. Now, however, the delay sections and the multiplying device need not process the 10-bit code words of the absolute code but only the 8-bit input code words, so that a considerable saving in storage capacity has been realized.

It should be noted that it is possible to replace the digital integrator 15 of FIG. 2 by a digital integrator having only one delay section, which realizes a delay over a period of time $T/m$. Then the multiplication factor of multiplier 21 should be chosen to be equal to $\alpha^{1/m}$. In order to ensure that the spectrum of the signal whose instantaneous amplitude is characterized by the digital output code words obtained in this manner, is the same as the spectrum of the signal whose instantaneous amplitude is characterized by the digital output code words obtained with the arrangement of FIG. 2, a minor change need only be made in the digital filter (for example a change in the filter coefficients $a_0$ to $a_7$ inclusive).

What is claimed is:

1. A circuit arrangement for converting a sequence of digital input code words occurring with a first sampling frequency ($F_s$) and representative of changes in the instantaneous amplitude of a data signal in the form of a differential code into a sequence of output code words occurring with a second, higher sampling frequency ($mf_s$) and representative of the instantaneous amplitude of the data signal in the form of an absolute code, comprising:

a non-recursive interpolating digital filter;
   means to apply input code words applied to said filter;
   means to output from said filter a sequence of digital auxiliary code words occurring with said second sampling frequency ($mf_s$) and which are also representative of changes in the instantaneous amplitude of the data signal; and
   a digital integrator for converting said auxiliary code words into said output code words;
   said digital integrator comprising:
   a cascade arrangement of m delay sections which each realize a delay over a period of time $1/mf_s$.

2. The circuit arrangement as claimed in claim 1, wherein said digital integrator comprises:
   an input terminal which receives a sequence of digital auxiliary code words occurring with said second sampling frequency ($mf_s$) and which words are representative of changes in the instantaneous amplitude of the data signal;
   an adding means in said digital integrator having as a first input said auxiliary code words;

an output of said adding means which supplies an output terminal with absolute code words;
a feedback circuit comprising:
at least one delay section;
a multiplier;
means to supply the output of said adder to said delay section and sequentially to said multiplier;

said multiplier multiplying said absolute code words by a factor les than 1;
the output of said multiplier being fedback as a second input to said adding means;
such that said delay section and said multiplying device process only the input code words, thus utilizing minimal storage capacity.

* * * * *